(12) United States Patent
Hein (10) Patent No.: US 7,835,197 B2
(45) Date of Patent: Nov. 16, 2010

(54) INTEGRATED SEMICONDUCTOR MEMORY WITH GENERATION OF DATA

(75) Inventor: Thomas Hein, Munich (DE)

(73) Assignee: Qimonda AG, Munich (DE)

( * ) Notice: Subject to any disclaimer, the term of this patent is extended or adjusted under 35 U.S.C. 154(b) by 900 days.

(21) Appl. No.: 11/731,763

(22) Filed: Mar. 30, 2007

(65) Prior Publication Data
US 2007/0247989 A1    Oct. 25, 2007

(30) Foreign Application Priority Data
Mar. 31, 2006    (DE) .................. 10 2006 015 114

(51) Int. Cl.
*G11C 7/06*    (2006.01)

(52) U.S. Cl. .................. 365/189.07; 365/198; 365/191; 365/194

(58) Field of Classification Search ............ 365/189.07, 365/191, 194, 230.08
See application file for complete search history.

(56) References Cited

U.S. PATENT DOCUMENTS

| | | | |
|---|---|---|---|
| 4,667,337 A | 5/1987 | Fletcher | |
| 5,890,005 A | 3/1999 | Lindholm | |
| 6,735,129 B2 * | 5/2004 | Akasaki et al. | ............. 365/194 |
| 7,411,840 B2 * | 8/2008 | Gaskins et al. | ......... 365/189.07 |

* cited by examiner

*Primary Examiner*—Pho M Luu
*Assistant Examiner*—Tha-O Bui
(74) *Attorney, Agent, or Firm*—Slater & Matsil, L.L.P.

(57) ABSTRACT

An integrated semiconductor memory with generation of data comprises a clock connection to apply a clock signal, a memory cell array with memory cells to store data of a first data record and a data generator circuit with a first input connection to apply the data of the first data record, with a first output connection to output data of a second data record, and with a second output connection to generate a first control signal. The data generator circuit includes an evaluation unit whose input is supplied with the first data record, the second data record and a second control signal, the second control signal being delayed by one clock period of the clock signal with respect to the first control signal. The data generator circuit is adapted to generate the data values of the data of the second data record in dependence on the evaluation of the data values of the first and second data record and the second control signal.

25 Claims, 8 Drawing Sheets

FIG 5

Table 1

| DS  | 0 | 1 | 2 | 3 | 4 | 5 | 6 | 7 |
|-----|---|---|---|---|---|---|---|---|
| DQ7 | 0 | 1 | 0 | 1 | 0 | 0 | 1 | 0 |
| DQ6 | 0 | 1 | 0 | 1 | 0 | 0 | 1 | 0 |
| DQ5 | 0 | 1 | 0 | 1 | 0 | 0 | 1 | 1 |
| DQ4 | 0 | 1 | 0 | 1 | 0 | 0 | 1 | 1 |
| DQ3 | 1 | 1 | 0 | 1 | 1 | 1 | 0 | 1 |
| DQ2 | 1 | 1 | 0 | 1 | 1 | 1 | 0 | 1 |
| DQ1 | 1 | 1 | 0 | 1 | 1 | 1 | 0 | 0 |
| DQ0 | 1 | 1 | 0 | 1 | 1 | 1 | 0 | 0 |

Table 2 comparison

| | 0 | 1 | 2 | 3 | 4 | 5 | 6 | 7 |
|-----|---|---|---|---|---|---|---|---|
| VA7 | 1 | 1 | 1 | 0 | 1 | 0 | 1 | 0 |
| VA6 | 1 | 1 | 1 | 0 | 1 | 0 | 1 | 0 |
| VA5 | 1 | 1 | 1 | 0 | 1 | 0 | 1 | 1 |
| VA4 | 1 | 1 | 1 | 0 | 1 | 0 | 1 | 1 |
| VA3 | 0 | 0 | 1 | 0 | 0 | 0 | 1 | 0 |
| VA2 | 0 | 0 | 1 | 0 | 0 | 0 | 1 | 0 |
| VA1 | 0 | 0 | 1 | 0 | 0 | 0 | 1 | 1 |
| VA0 | 0 | 0 | 1 | 0 | 0 | 0 | 1 | 1 |
| change | 4 | 4 | 8 | 0 | 4 | 0 | 8 | 4 |
| change + DBI2 | 5 | 4 | 8 | 1 | 4 | 0 | 8 | 5 |

Table 3

| | 0 | 1 | 2 | 3 | 4 | 5 | 6 | 7 |
|-----|---|---|---|---|---|---|---|---|
| D7 | 1 | 0 | 1 | 1 | 1 | 0 | 0 | 0 | 0 |
| D6 | 1 | 0 | 1 | 1 | 1 | 0 | 0 | 0 | 0 |
| D5 | 1 | 0 | 1 | 1 | 1 | 0 | 0 | 0 | 1 |
| D4 | 1 | 0 | 1 | 1 | 1 | 0 | 0 | 0 | 1 |
| D3 | 1 | 1 | 1 | 1 | 1 | 1 | 1 | 1 | 1 |
| D2 | 1 | 1 | 1 | 1 | 1 | 1 | 1 | 1 | 1 |
| D1 | 1 | 1 | 1 | 1 | 1 | 1 | 1 | 1 | 0 |
| D0 | 1 | 1 | 1 | 1 | 1 | 1 | 1 | 1 | 0 |
| DBI1 | 1 | 0 | 0 | 1 | 0 | 0 | 0 | 1 | 0 |
| change + DBI1 | | 5 | 4 | 1 | 1 | 4 | 0 | 1 | 5 |

Max. change   5

FIG 6

Table 1

| | DS | 0 | 1 | 2 | 3 | 4 | 5 | 6 | 7 |
|---|---|---|---|---|---|---|---|---|---|
| | DQ7 | 0 | 1 | 0 | 1 | 0 | 0 | 1 | 0 |
| | DQ6 | 0 | 1 | 0 | 1 | 0 | 0 | 1 | 0 |
| | DQ5 | 0 | 1 | 0 | 1 | 0 | 0 | 1 | 1 |
| | DQ4 | 0 | 1 | 0 | 1 | 0 | 0 | 1 | 1 |
| | DQ3 | 1 | 1 | 0 | 1 | 1 | 1 | 0 | 1 |
| | DQ2 | 1 | 1 | 0 | 1 | 1 | 1 | 0 | 1 |
| | DQ1 | 1 | 1 | 0 | 1 | 1 | 1 | 0 | 0 |
| | DQ0 | 1 | 1 | 0 | 1 | 1 | 1 | 0 | 0 |

Table 2

| | | | | | | | | | |
|---|---|---|---|---|---|---|---|---|---|
| comparison | VA7 | 1 | 0 | 0 | 1 | 0 | 1 | 0 | 1 |
| | VA6 | 1 | 0 | 0 | 1 | 0 | 1 | 0 | 1 |
| | VA5 | 1 | 0 | 0 | 1 | 0 | 1 | 0 | 0 |
| | VA4 | 1 | 0 | 0 | 1 | 0 | 1 | 0 | 0 |
| | VA3 | 0 | 1 | 0 | 1 | 1 | 1 | 0 | 1 |
| | VA2 | 0 | 1 | 0 | 1 | 1 | 1 | 0 | 1 |
| | VA1 | 0 | 1 | 0 | 1 | 1 | 1 | 0 | 0 |
| | VA0 | 0 | 1 | 0 | 1 | 1 | 1 | 0 | 0 |
| change | | 4 | 4 | 0 | 8 | 4 | 8 | 0 | 4 |
| change + DBI2 | | 5 | 5 | 1 | 8 | 5 | 9 | 1 | 4 |

Table 3

| | | | | | | | | | |
|---|---|---|---|---|---|---|---|---|---|
| | D7 | 1 | 1 | 0 | 0 | 0 | 1 | 1 | 1 | 0 |
| | D6 | 1 | 1 | 0 | 0 | 0 | 1 | 1 | 1 | 0 |
| | D5 | 1 | 1 | 0 | 0 | 0 | 1 | 1 | 1 | 1 |
| | D4 | 1 | 1 | 0 | 0 | 0 | 1 | 1 | 1 | 1 |
| | D3 | 1 | 0 | 0 | 0 | 0 | 0 | 0 | 0 | 1 |
| | D2 | 1 | 0 | 0 | 0 | 0 | 0 | 0 | 0 | 1 |
| | D1 | 1 | 0 | 0 | 0 | 0 | 0 | 0 | 0 | 0 |
| | D0 | 1 | 0 | 0 | 0 | 0 | 0 | 0 | 0 | 0 |
| | DBI1 | 1 | 1 | 1 | 0 | 1 | 1 | 1 | 0 | 0 |
| change + DBI1 | | | 4 | 4 | 1 | 1 | 4 | 0 | 1 | 4 |

Max. change   4

| Number of switched bits between clock cycles | State of DBI 2 | |
|---|---|---|
| | DBI1 DBI2=0 | DBI1 DBI2=1 |
| 0 | 0 | 0 |
| 1 | 0 | 0 |
| 2 | 0 | 0 |
| 3 | 0 | 0 |
| 4 | 0 | 1 |
| 5 | 1 | 1 |
| 6 | 1 | 1 |
| 7 | 1 | 1 |
| 8 | 1 | 1 |

US 7,835,197 B2

INTEGRATED SEMICONDUCTOR MEMORY WITH GENERATION OF DATA

This application claims priority to German Patent Application 10 2006 015 114.3, which was filed Mar. 31, 2006, and is incorporated herein by reference.

BRIEF DESCRIPTION OF THE DRAWINGS

Exemplary embodiments of the invention will be explained in more detail below with reference to figures in which.

DETAILED DESCRIPTION OF ILLUSTRATIVE EMBODIMENTS

In an integrated semiconductor memory, for example a DRAM (Dynamic Random Access Memory) semiconductor memory, data are stored in memory cells of a memory cell array with a data value "0" or a data value "1". In the event of a read access to the integrated semiconductor memory, a data record which comprises a plurality of such data items is generally read from the memory cell array and the data are output at one or more data connections of the integrated semiconductor memory. In the case of an x8 form of organization of the integrated semiconductor memory, eight data items are simultaneously output at eight data outputs, for example.

In the case of successive read accesses, the state of a data line must be changed from one clock pulse to the next if the data values on the data line in question have changed. To this end, the charge of a data line which is connected to a data connection must be reversed. Such charge-reversal operations give rise to dynamic power consumption and noise. The noise is caused by ISI (Inter-Symbol Interference) effects and SSO (Simultaneous Switch Noise) effects. ISI effects occur when the states of two data items on a common data line influence one another. SSO effects occur, in particular, on account of charge-reversal operations on the data lines. In this case, adjacent data lines influence one another.

In order to reduce the charge-reversal operations on the data lines and the mutual influence of the data lines during charge-reversal operations, data are transmitted from the memory cell array with the data values which are also stored in the memory cells or with data which are inverted with respect to said data values. In this case, a check is carried out in order to determine how many data lines must have their charge reversed when reading out a data record in comparison with the data record read out one clock period beforehand. If the charge of more than half of all data lines must be reversed from one clock pulse to the next, the data are transmitted from the memory cell array in inverted form. To this end, in addition to the data lines, provision is made of a control line on which a control signal is transmitted, said control signal indicating whether the data generated at the data connections are present in the inverted or non-inverted state. This reduces the switching activity to a maximum of 4 bits in the case of an x8 form of organization. A data receiver evaluates the control signal, which is output at an output connection of the integrated semiconductor memory, and possibly carries out back-inversion of the received data again on the basis of this evaluation.

Figure 1:
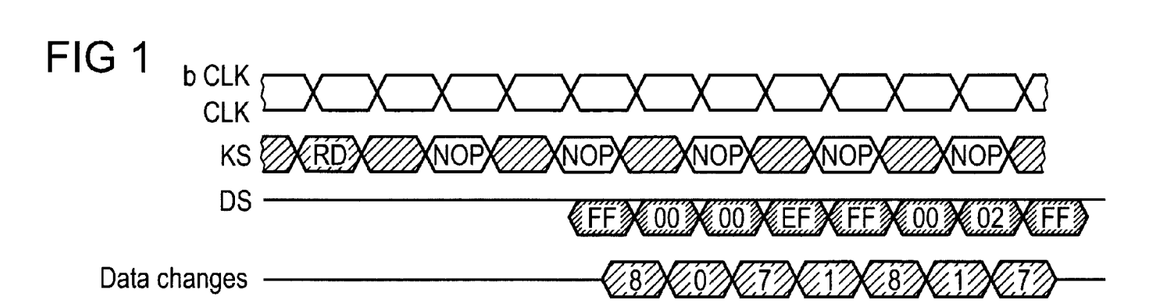
FIG. 1 shows a signal state diagram when reading data records from a memory cell array.

FIG. 1 shows a signal state diagram with a differential clock signal CLK, and bCLK (alternatively bCLK can be a signal that is inverted with respect to the signal CLK), control signals KS and data records DS, which occur when reading memory cells at data connections of the integrated semiconductor memory. In this case, the data of the data records DS are output with the data values stored in the memory cells to be read. Data inversion thus does not take place. As a result of a read command RD, a plurality of data records DS with the data values FF, 00, 00, EF, FF, 00, 02 and FF are read out in succession. The fourth row of signals indicates the number of data bits whose states change from one clock period to the next when reading out the data records at the data connections. If the data records to be read out comprise eight data items, the charge of up to eight data lines may need to be reversed in the worst case scenario. This is the case in FIG. 1 when transmitting the data record with the data values FF and when subsequently transmitting the data record 00, for example.

Figure 2:
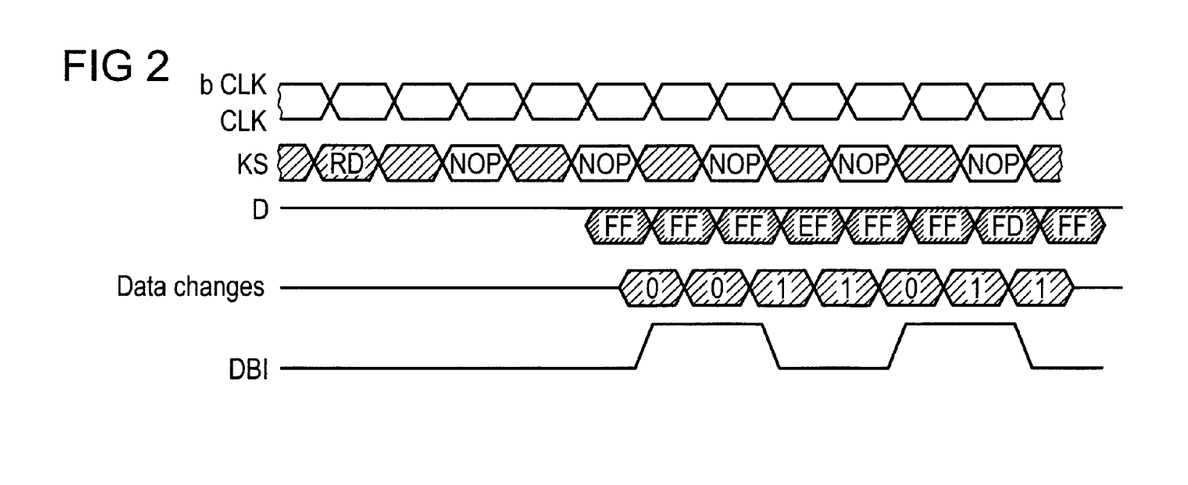
FIG. 2 shows another signal state diagram when reading data records from a memory cell array.

FIG. 2 shows the signal state diagram of an embodiment of the integrated semiconductor memory with data transmission, in which the data values of successive data records are inverted (DBI=1) or are not inverted (DBI=0) on the basis of a state of a control signal DBI. Whereas eight data bits have changed, for example when successively transmitting the data records with the data values FF and 00 shown in FIG. 1, a charge-reversal operation is no longer carried out when the data values 00 are inverted to form the data values FF shown in FIG. 2. The number of data bits which change when successively transmitting data records is therefore considerably reduced in FIG. 2 in comparison with FIG. 1.

Figure 3:
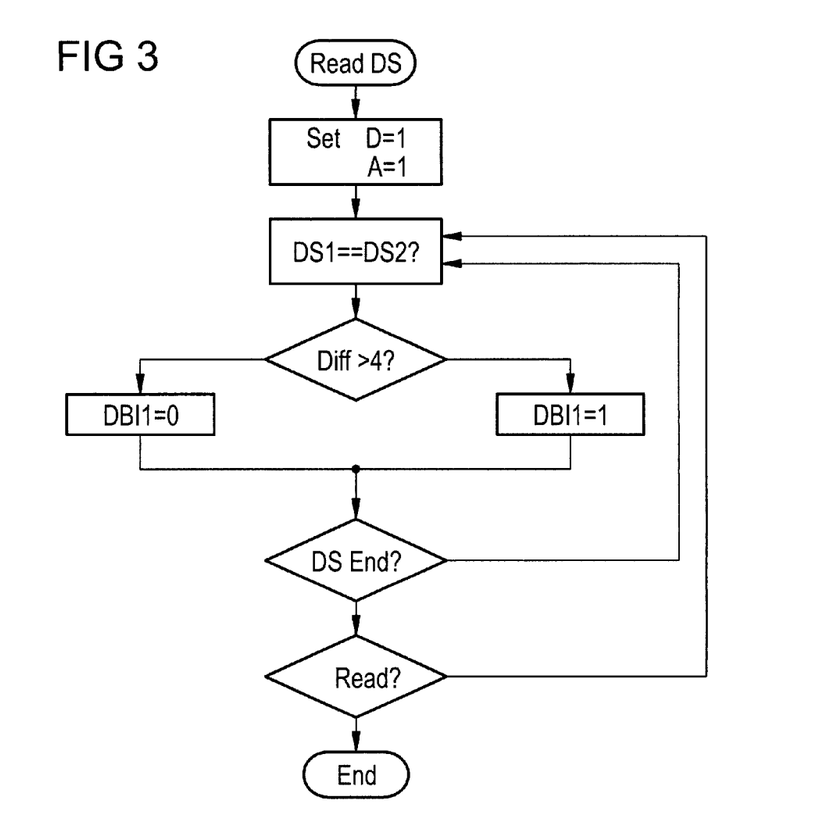
FIG. 3 shows a flowchart of a method for generating data values of a data record.

FIG. 3 shows a signal flowchart of an embodiment of a method for generating data, in which data values of data are output in inverted form at data connections under particular conditions. In order to read out a data record, a read command is first of all applied to a control connection of the integrated semiconductor memory. Data connections D of the integrated semiconductor memory and an output connection A of the integrated semiconductor memory are first of all in a high potential state "1". As a result of the read command, a data record DS1 is then read from the memory cell array of the integrated semiconductor memory. The data values of the data of the data record DS1 are compared with the data values of the data of a data record DS2 which was output one clock cycle beforehand at the data output connections of the integrated semiconductor memory.

If more than half of the data of the data record DS1, four data values in the case of an x8 form of organization, differ from the data values of the data of the data record DS2, the control signal DBI is generated with the state "1". If fewer than half of the data values have changed, the control signal DBI is generated with a state "0". In the first case, the data values of the data of the data record DS1 are output in inverted form at the data connections of the integrated semiconductor memory. In the second case, if the control signal DBI has the state "0", the data values of the data of the data record DS1 are transmitted in non-inverted form or are transmitted with the data values with which they were stored in the memory cell array. If further data records are intended to be read out, the data values which were read out beforehand are again compared with the data values which are currently to be read out.

Figure 4:
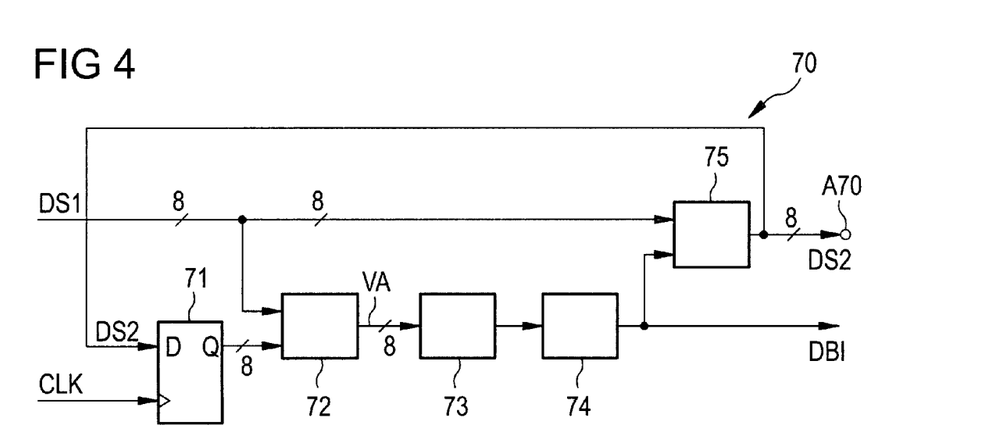
FIG. 4 shows one embodiment of a data generator circuit for generating data values of a data record.

FIG. 4 shows an embodiment of a circuit arrangement of a data generator circuit 70 which is intended to generate a data record DS2 and whose input is supplied with the data record DS1 from the memory cell array of the integrated semiconductor memory. The data generator circuit 70 has a memory circuit 71 which is driven by a clock signal CLK. An output connection A70 of the data generator circuit 70, at which the data record DS2 is generated, is feedback-coupled to the input of the memory circuit 71. The memory circuit 71 is in the form of a flip-flop circuit, for example. Its output is connected to a comparator circuit 72. The comparator circuit 72 is supplied with the data record DS1 from the memory cell array for one clock period of the clock signal CLK. Furthermore, the data record DS2 which was read out one clock period beforehand and is buffer-stored in the memory circuit 71 is likewise supplied to the comparator circuit 72. The comparator circuit 72 is in the form of an XOR circuit, for example. It thus compares the individual data values of the data of the data record DS1 with the data values of the data of the data record DS2.

Those states of an output signal VA which were generated by the XOR circuit 72 and indicate different data values of the data records DS1 and DS2 are then summed in an addition circuit 73. A downstream evaluation circuit 74 checks whether more than half of the data values of the data of the data record DS1, which have been read out, differ from the data values of the data of the data record DS2.

Figure 5:
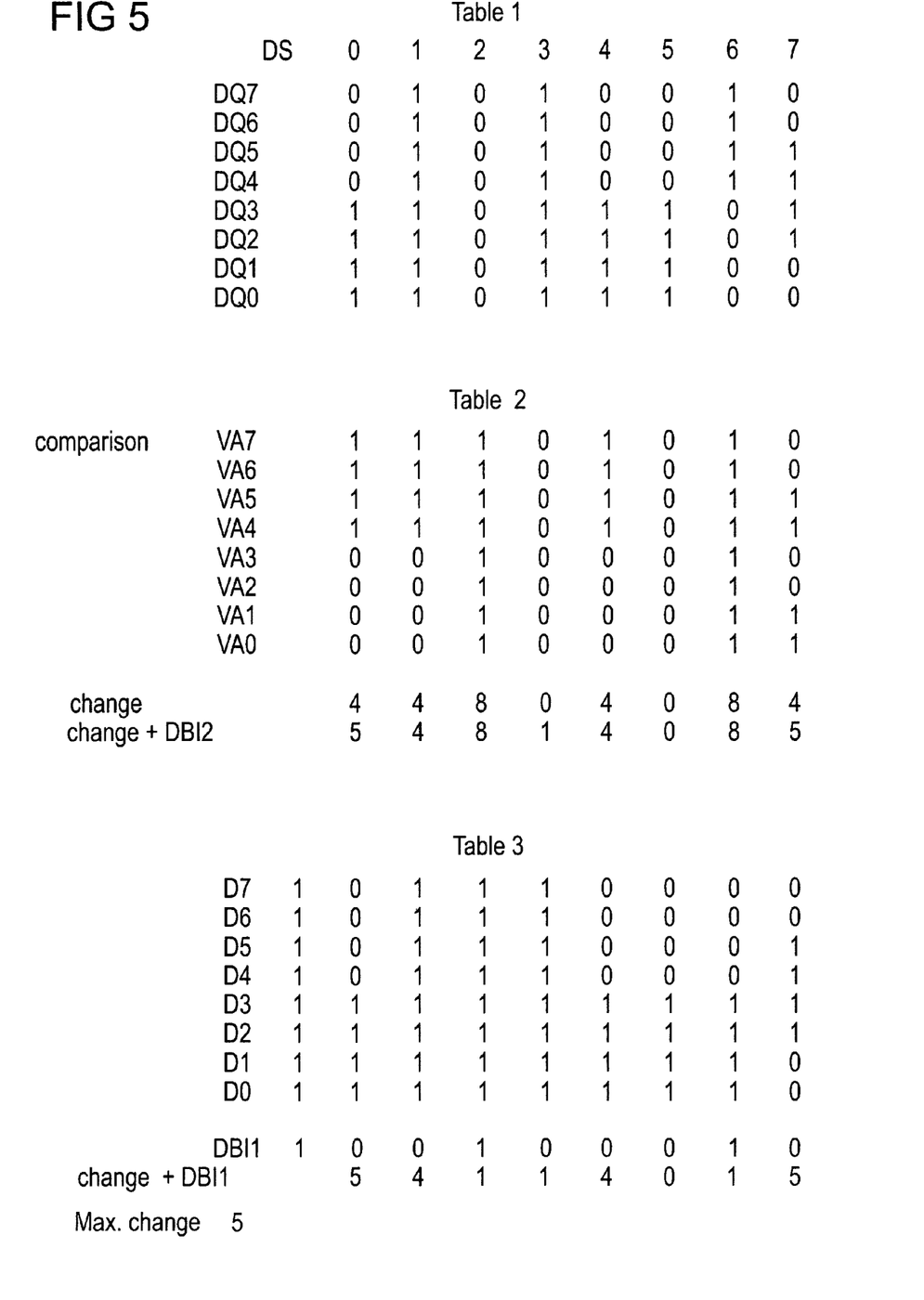
FIG. 5 shows data values of a plurality of data records during an operation of reading from a memory cell array.

FIG. 5 shows an embodiment of a data generator circuit in a semiconductor memory having the x8 form of organization, in which the evaluation circuit 74 is used to check whether more than four data values of the data of the data record DS1 differ from the data values of the data of the data record DS2. If more than half of the data values differ, the evaluation circuit generates the control signal DBI with a state "1" which is supplied to a comparator circuit 75, as shown in FIG. 4. In this case, the comparator circuit 75 which is in the form of an XOR circuit, for example, inverts the data values of the data of the data record DS1 and forwards them as the data record DS2 to the output connection A70. If fewer than half of the data values of the two data records DS1 and DS2 differ, the evaluation circuit 74 generates the control signal DBI with the state "0", with the result that the XOR circuit 75 transmits the data values of the data of the data record DS1 to the output connection A70 in non-inverted form.

FIG. 5 uses an example to illustrate the principle of data inversion. Table 1 of FIG. 5 indicates the data values of data DQ0, . . . , DQ7 of eight successive data records DS0, . . . , DS7 which are read from the memory cell array of an integrated semiconductor memory. Table 3 indicates which data values are actually generated at the data connections D0, . . . , D7 of the integrated semiconductor memory. Table 2 indicates whether the data values of a data record DS to be read out differ from the data values which were generated one clock period beforehand at the data connections.

Before a first data record DS0 is read out, the data connections of the integrated semiconductor memory and the output connection for outputting the control signal DBI are at a high signal level (data level "1"). When reading out a first data record DS0, data DQ0, . . . , DQ7 with the data values 11110000 are read from the memory cell array. The data values of the individual data items DQ0, . . . , DQ7 of the data record DS0 are compared with the data levels which were generated one clock period beforehand at the data connections D0, . . . , D7. Since the data values of the data DQ0, . . . , DQ3 match the data levels at the data connections D0, . . . , D3, the output signals VA0, . . . , VA3 from the comparator circuit 72 are set to "0" in table 2. Since the data values of the data DQ4, . . . , DQ7 have the data values 0000 and the data levels 1111 are applied to the data connections D4, . . . , D7, that is to say the data values differ from one another, the output signals VA4, . . . , VA7 from the comparator circuit 72 are set to the state "1" as shown in table 2 in FIG. 5.

In order to generate the data DQ0, . . . , DQ7 with the data values 11110000, the charge of four data lines which are connected to the data connections D4, D5, D6 and D7 must therefore be reversed. Since the charge of only half of the data lines which are activated during a read operation has to be reversed, the evaluation circuit 74 generates the control signal DBI with the state "0". The charge of the output connection of the integrated semiconductor memory, at which the control signal DBI is generated, must thus also be reversed from the initial state "1" to the new state "0". In total, the charge of five lines, four data lines and one control line, must therefore be reversed.

In the embodiment of the method for generating data described above, in which inversion is carried out when more than four data values on the data lines change, the switching activity for the pure data bits is reduced to 50%. However, the fact that the additional control signal DBI likewise has to be changed over is not taken into account. As can be gathered from FIG. 5, up to five data changes, four data changes on the data lines and one data change on the control line for transmitting the control signal DBI, thus occur in the worst case scenario. The charge-reversal activity is thus reduced to 37.5%.

Figure 6:
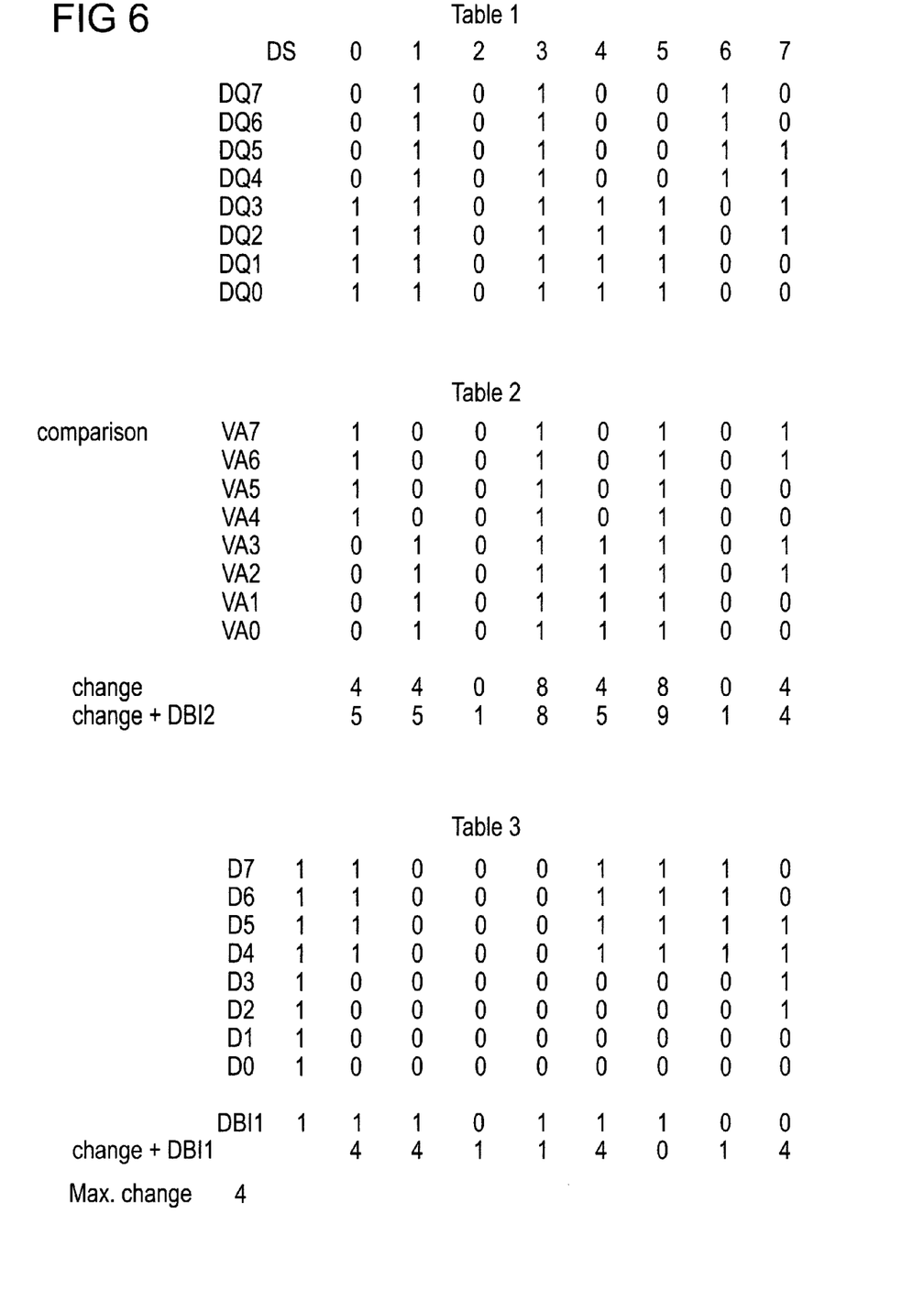
FIG. 6 shows data values of a plurality of data records during an operation of reading from a memory cell array.

Table 1 of FIG. 6 shows data values of data DQ0, . . . , DQ7 of data records DS0, . . . , DS7 which are read from a memory cell array of the integrated semiconductor memory. Table 3 shows the data values of a data record which has been read out, said data values being generated at data connections D0, . . . , D7, as well as the state of a control signal DBI, said state occurring at an output connection of the integrated semiconductor memory. Table 2 shows states of output signals VA0, . . . , VA7 from a comparator circuit, which states occur when data values of the data DQ0, . . . , DQ7 are compared with the data generated at the data connections D0, . . . , D7.

Before a data record DS0 is read from the memory cell array of an integrated semiconductor memory, the state level "1" is respectively generated at the data connections D0, . . . , D7 and at the output connection for generating the control signal DBI. The data DQ0, . . . , DQ7 of the data record DS0 having the data values 11110000 are then read out. When the data values 11111111 which are applied to the data connections D0, . . . , D7 are compared with the data values of the data record DS0 which have been read from the memory cell array, a comparator circuit generates the output signals VA0, . . . , VA7 with the levels 00001111. The 0 states of the output signals VA0, . . . , VA3 indicate that the data values which were generated at the data connections D0, . . . , D3 one clock period before reading out the data record DS0 match the data values of the data DQ0, ..., DQ3 of the data record DS0. In contrast, the comparator circuit generates the output signals VA4, ..., VA7 with a 1 state since the levels at the data connections D4, ..., D7 of the integrated semiconductor memory differ from the data values of the data DQ4, ..., DQ7 of the data record DS0.

When transmitting data without data inversion, the charge of four data lines, those data lines which are connected to the data connections D4, ..., D7 in the present example, must therefore be reversed. According to an embodiment of the invention, the data values of the data record DS0 are transmitted in inverted form if, when the data record DS0 is being read out, more than four data values of the data of the data record DS0 differ from the data values generated at the data connections D0, ..., D7 one clock period beforehand and if the control signal DBI1 was additionally generated with the state "1" in the case of a read access carried out in the clock period beforehand.

When transmitting the data record DS0, the charge of those data lines which are connected to the data connections D4, ..., D7 must be reversed. Furthermore, the control signal DBI1 was generated with the state "1" one clock period before reading out the data record DS0. Therefore, according to the invention, the data values of the data DQ0, ..., DQ7 of the data record DS0 are inverted and are generated with the data values 00001111 at the data connections D0, ..., D7.

As can be seen from FIG. 6, four data changes occur in this embodiment of the method on the data lines, which are connected to the data connections D0, ..., D7, and on the control line for transmitting the control signal DBI1, whereas up to five state changes occurred when reading out a data record and the data values of successive data records were compared with one another.

According to the embodiment of the present invention described according to FIG. 6, only a maximum of four state changes of nine possible state changes thus occur on the data lines for transmitting the data DQ0, ..., DQ7 and on the control signal line for transmitting the control signal DBI1. This reduces the switching activity by 20% in comparison to the embodiment of the method described according to FIG. 5, which is simultaneously associated with a higher data transmission speed.

Figure 7:
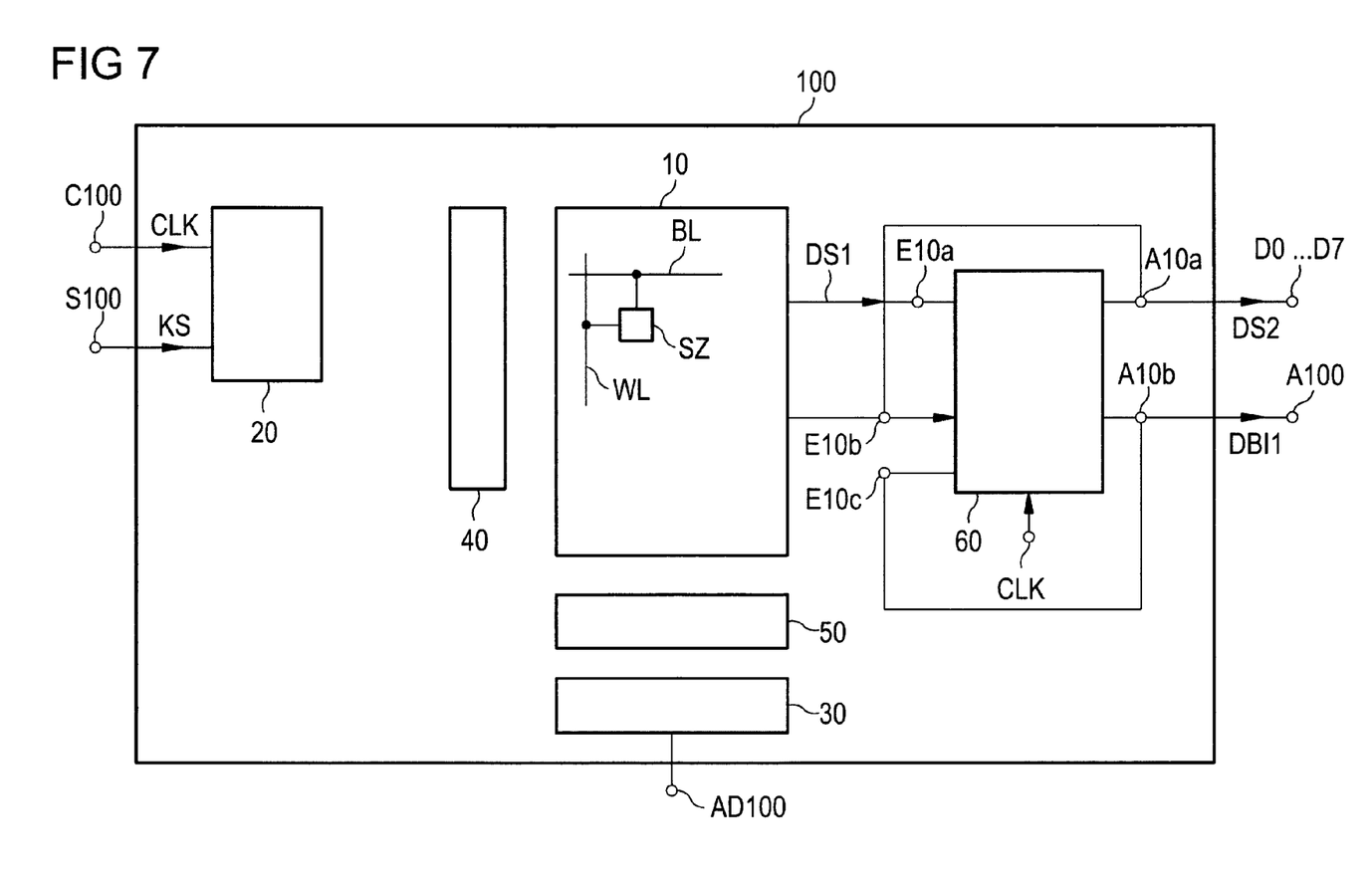
FIG. 7 shows an integrated semiconductor memory having a data generator circuit for generating data values of a data record.

FIG. 7 shows an embodiment of an integrated semiconductor memory 100 having a memory cell array 10 in which memory cells SZ are arranged in the form of a matrix at crossover points between word lines WL and bit lines BL. In order to read a data record from memory cells of the memory cell array 10, a clock signal CLK is applied to a clock connection C100 of a control circuit 20 and a command signal KS is applied to a control connection S100. An address signal AS is applied to an address connection AD100 which is connected to an address register 30. At least one memory cell is selected for a read access on the basis of the applied address using a row decoder 40 and a column decoder 50. In the case of an x8 form of organization, eight memory cells are read during a read access.

The data DQ0, ..., DQ7 of a data record DS1 which have been read out are supplied to an input connection E60a of a data generator circuit 60. The data generator circuit 60 generates, at the output at an output connection A60a, a data record DS2 whose data DQ, ..., DQ7 are output at data connections D0, ..., D7 of the integrated semiconductor memory 100. The output connection A60a is feedback-coupled to an input connection E60b of the data generator circuit 60. At a further output connection A60b, the data generator circuit 60 generates the control signal DBI1 which is fed back to an input connection E60c of the data generator circuit 60. Furthermore, a clock signal CLK is supplied to the data generator circuit 60.

Figure 8:
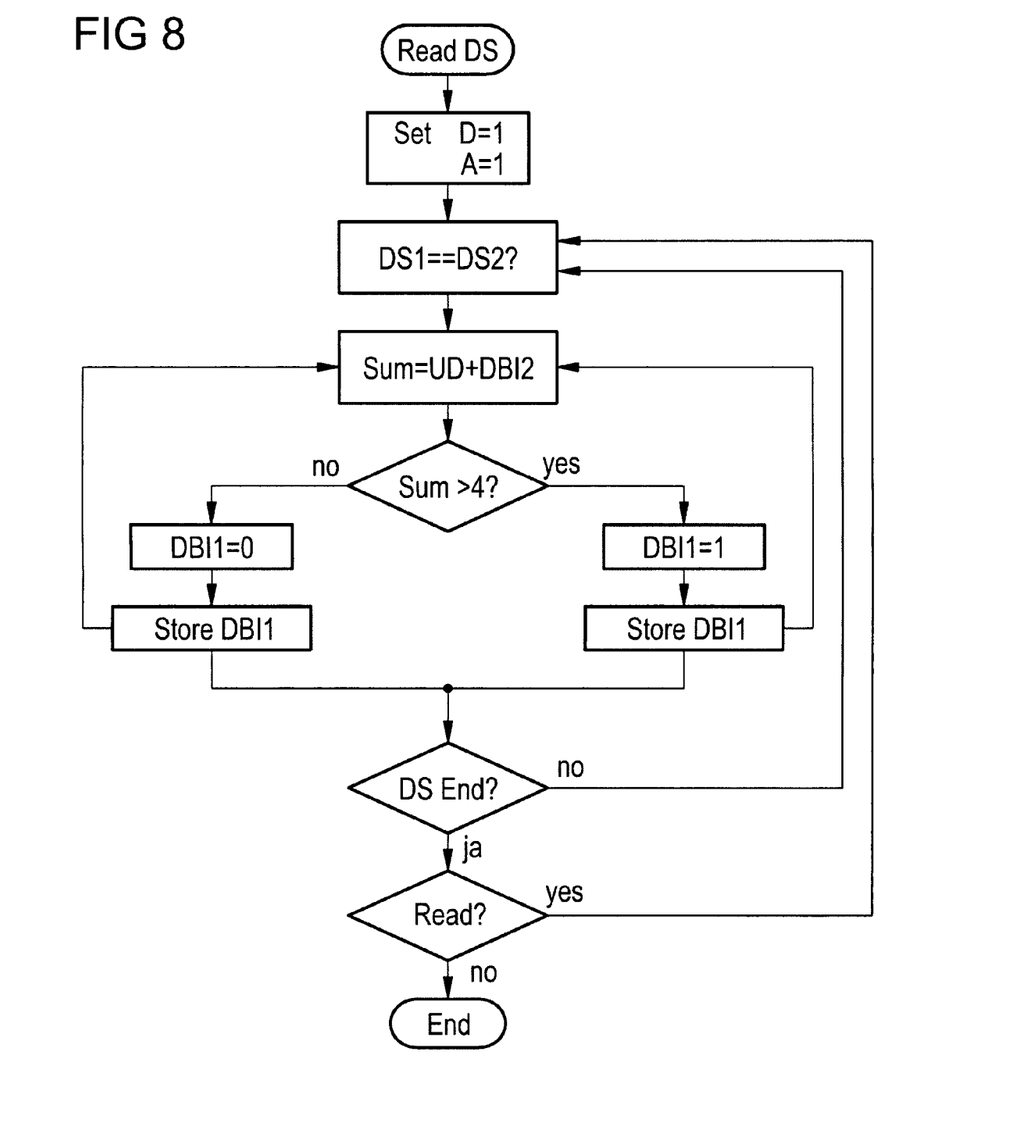
FIG. 8 shows a flowchart of a method for generating data values of a data record.

FIG. 8 shows a flowchart of an embodiment of a method for generating data using the data generator circuit 60. After a read command RD has been applied to the control connection S100 of the control circuit 20, the data level "1" is first of all generated at all data connections D0, ..., D7. Furthermore, the control signal DBI1 is likewise generated with the state "1" at the output connection A100. In a next step, the data values of the data of a data record DS1 which has been read from the memory cell array are compared with the data values of a data record DS2 which are currently applied to the data connections D0, ..., D7. If more than half of the data values are different and the control signal DBI1, which was generated during the read access one clock period beforehand, additionally has the state "1", the control signal DBI1 is again set to the state "1". In this case, the data values of the data of the data record DS1 are generated in inverted form at the data connections D0, ..., D7. If fewer than half of the data values of a data record to be read out differ from data values which are currently applied to the data connections, the control signal DBI1 is generated with the state "0". In this case, the data values of the data record DS1 are not inverted. The state of the control signal DBI1 is then buffer-stored and taken into account again during the decision relating to whether the data values of a data record which have been read out will be inverted during a next read access.

Figure 9:
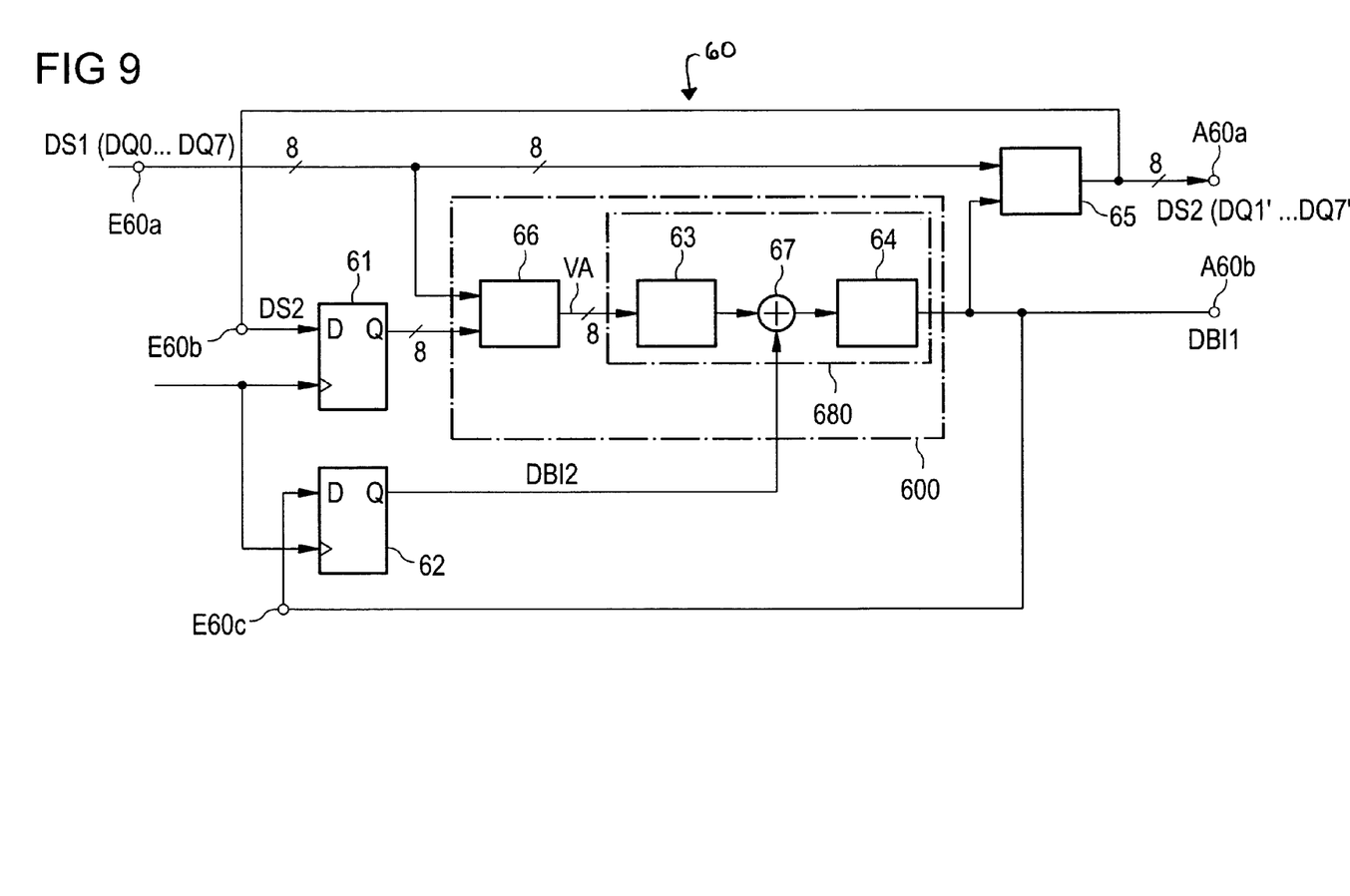
FIG. 9 shows one embodiment of a data generator circuit for generating data values of a data record.

FIG. 9 shows an embodiment of a circuit arrangement of the data generator circuit 60. The data generator circuit 60 has an input connection E60a for applying the data record DS1 containing the data DQ0, ..., DQ7. The input connection E60a supplies the data record DS1 to a comparator circuit 65 which is in the form of an XOR circuit. The output of the XOR circuit 65 is connected to the output connection A60a for generating the data record DS2 containing the data DQ0', ..., DQ7'. The data record DS2 is fed back to the input connection E60b of the data generator circuit 60 which is connected to a memory circuit 61. A memory circuit 62 which is connected to an input connection E60c is furthermore provided.

The output of the memory circuit 61 is connected to a comparator circuit 66 which is in the form of an XOR circuit. The inputs of the comparator circuit 66 are supplied with the data record DS1 and with the data record DS2 which is buffer-stored in the memory circuit 61. The comparator circuit 66 thus compares the data values of the data of the data record DS1 with the data values of the data record DS2 which were generated one clock period beforehand. The comparator circuit 66 generates a plurality of output signals VA0, ..., VA7 at the output, a respective state of an output signal VA0, ..., VA7 being generated with a level of 1 if a data value of a data item of the data record DS1 differs from a data value of a corresponding data item of the data record DS2. If data values of the mutually corresponding data of the two data records DS1 and DS2 match, the comparator circuit 66 generates the corresponding output signal VA0, ..., VA7 with a 0 state at the output.

The output signals from the comparator circuit 66 are supplied to a decision circuit 680. The decision circuit 680 comprises an addition circuit 63 and an addition element 67. The addition circuit 63 sums the 1 states of the output signals VA0, ..., VA7 from the comparator circuit 66. If a control signal DBI2 has likewise been stored with a 1 state in the memory circuit 62, a counter reading signal at the output of the addition element 67 increases once more.

In the case of an x8 form of organization, an evaluation circuit 64 is used to determine whether the 1 state has occurred at least four times in the output signals VA0, . . . , VA7 from the comparator circuit 66 and the control signal DBI2 likewise additionally has the 1 state. In this case, the evaluation circuit 64 generates, at the output, the control signal DBI1 with a 1 state which is supplied to the input of the comparator circuit 65. The evaluation circuit 64 generates the 1 state of the control signal DBI1 if at least half of the data of the data record DS1 differ from the data of the data record DS2 and the control signal DBI2 additionally has the 1 state.

If the control signal DBI1 has the 1 state, the comparator circuit 65 which is in the form of an XOR circuit inverts the data values of the data of the data record DS1 and supplies them, as data values of the data record DS2, to the output connection A60a of the data generator circuit. The control signal DBI1 is also fed back to the input connection E60c, which is connected to the memory circuit 62, and is buffer-stored in the memory circuit 62.

Since the memory circuit 61 and the memory circuit 62 are driven by the clock signal CLK, the data values of the data record DS1 which have been read from the memory cell array are compared with the data values of the data record DS2, which were generated beforehand and are buffer-stored in the memory circuit 61, and with the state of the control signal DBI1 buffer-stored in the memory circuit 62 beforehand. The data values of the data record DS1 are inverted or not inverted on the basis of the above-described comparison of the data values of the data records DS1 and DS2 and taking into account the state of the control signal DBI2.

Figure 10:
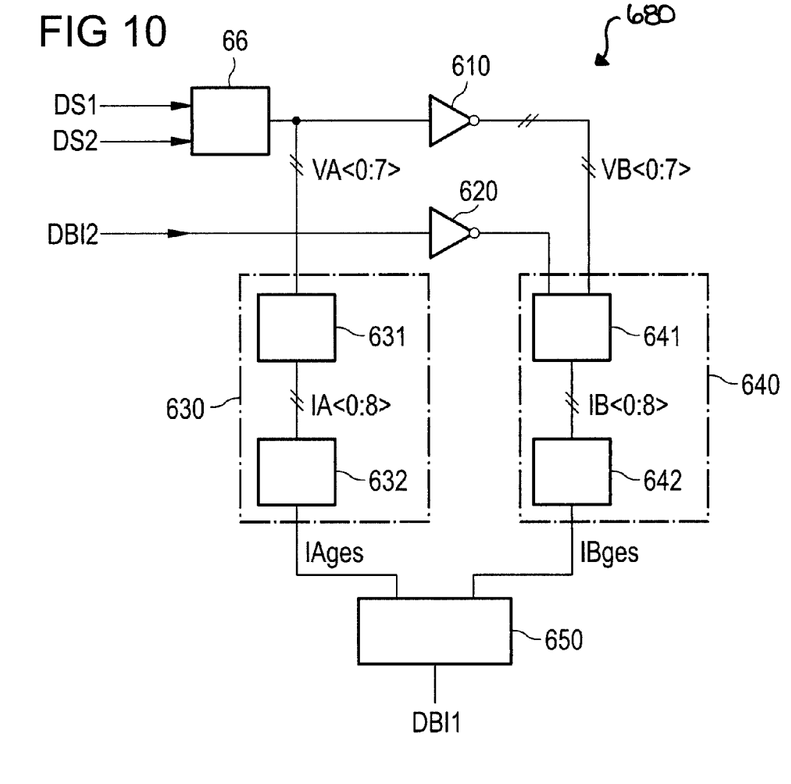
FIG. 10 shows a decision circuit of a data generator circuit for generating data values of a data record.

FIG. 10 shows an embodiment of the decision circuit 680. The decision circuit has a current generation unit 630 and a current generation unit 640. The current generation unit 630 comprises a voltage-current converter 631 which is connected to an addition circuit 632. The current generation unit 640 comprises a voltage-current converter 641 which is connected to an addition circuit 642.

The state of the control signal DBI2 as well as the states of the output signals VA0, . . . , VA7 from the comparator circuit 66 are supplied to the input of the voltage-current converter 631. When a 1 state occurs in the output signals VA0, . . . , VA7 and a 1 state occurs in the control signal DBI2, the voltage-current converter 631 respectively generates current contributions IA0, . . . , IA8 which are summed by the addition circuit 632. The output signals from the comparator circuit 66 are supplied in inverted form, as output signals VB0, . . . , VB7, to the voltage-current converter 641. The voltage-current converter 641 is likewise driven by the inverted state of the control signal DBI2. When a 1 state occurs in the inverted control signal DBI2 and 1 states occur in the inverted output signals VA0, . . . , VA7 from the comparator circuit 66, the voltage-current converter 641 respectively generates a current contribution IB0, . . . , IB8, said contributions being summed by the addition circuit 642.

After the current contributions IA0, . . . , IA8 have been summed, the addition circuit 632 generates, at the output, a current IAges whose current intensity corresponds to the occurrence of the 1 state in the output signals VA0, . . . , VA7 and to the occurrence of the 1 state in the control signal DBI2. After the current contributions IB0, . . . , IB8 have been summed, the addition circuit 642 generates, at the output, a current IBges whose current intensity corresponds to the occurrence of the 1 state in the inverted control signal DBI2 and to the occurrence of the 1 state in the inverted output signals VA0, . . . , VA7.

The currents IAges and IBges are supplied to a comparator circuit 650. If the current intensity of the current IAges is greater than the current intensity of the current IBges, the comparator circuit 650 generates the control signal DBI1 with the 1 state. If, in contrast, the current intensity of the current IAges is less than the current intensity of the current IBges, the comparator circuit 650 generates the control signal DBI1 with the 0 state.

Figure 11:
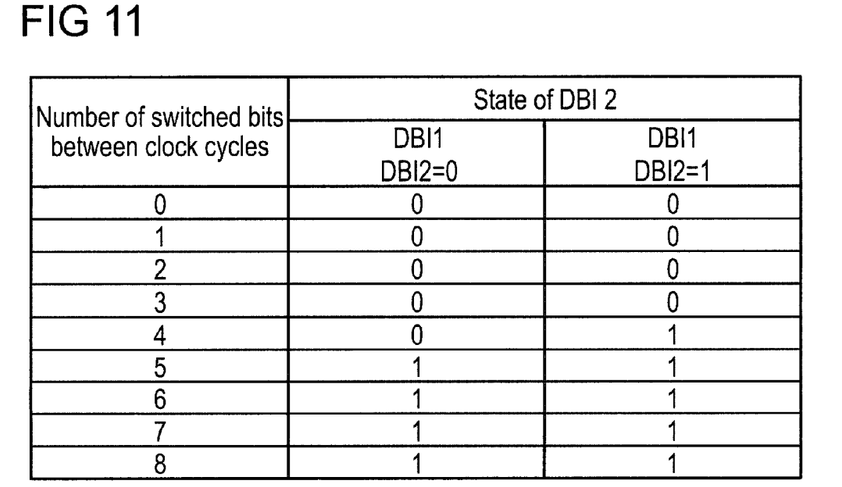
FIG. 11 shows states of a control signal which is generated using a decision circuit for the purpose of generating data values of a data record.

FIG. 11 shows a truth table for the decision circuit 680. The state of the control signal DBI1 changes from the 0 state to the 1 state if the charge of at least half of the data lines which are connected to the data connections D0, . . . , D7 has to be reversed and the control signal DBI2 has the 1 state. In this case, the data values of the data record DS1 which have been read out are generated in inverted form at the data connections D0, . . . , D7. If, in contrast, although the charge of half of the data lines which are connected to the data connections D0, . . . , D7 has to be reversed, the control signal DBI2 has the 0 state, the control signal DBI1 is generated with the 0 state. In this case, the data values of the data record DS1 which have been read out are generated in non-inverted form at the data connections D0, . . . , D7.

What is claimed is:

1. An integrated semiconductor memory, comprising:
   a clock connection to apply a clock signal;
   a memory cell array with memory cells to store data of a first data record that has a first or a second data value;
   a data generator circuit with a first input connection to apply the data of the first data record, with a first output connection to output data of a second data record that has a first or a second data value, and with a second output connection to generate a first control signal; and
   an evaluation unit with input to receive the first data record, the second data record and a second control signal, the second control signal being delayed by one clock period of the clock signal with respect to the first control signal;
   wherein the data generator circuit is adapted to generate the data values of the data of the second data record in dependence on the evaluation of the data values of the first and second data record and the second control signal from the evaluation unit.

2. The integrated semiconductor memory as claimed in claim 1,
   wherein the data generator circuit has a second input connection to apply the second data record that is coupled to the first output connection of the data generator circuit to output the second data record; and
   wherein the data generator circuit comprises a third input connection to apply the first control signal that is coupled to the second output connection of the data generator circuit to output the first control signal.

3. The integrated semiconductor memory as claimed in claim 2, comprising:
   a first memory circuit to store the data of the second data record that is coupled to the second input connection of the data generator circuit; and
   a second memory circuit to store a first or a second state of the first control signal that is coupled to the third input connection of the data generator circuit.

4. The integrated semiconductor memory as claimed in claim 3, wherein the evaluation unit comprises a comparator circuit to generate output signals, wherein an input of the comparator circuit is coupled to the first input connection of the data generator circuit and to the first memory circuit, the evaluation unit being supplied with the first data record from the first input connection of the data generator circuit and the second data record, which has been delayed by one clock period, from the first memory circuit.

5. The integrated semiconductor memory as claimed in claim 4,
wherein the evaluation unit comprises a decision circuit whose input is supplied with the output signals from the comparator circuit of the evaluation unit and a state of the second control signal; and
wherein the decision circuit is adapted to generate, at the output, the first control signal in dependence on the output signals of the comparator circuit and the state of the second control signal.

6. The integrated semiconductor memory as claimed in claim 5,
wherein the data generator circuit comprises a comparator circuit whose input is coupled to the first input connection of the data generator circuit to receive the data of the first data record and to the decision circuit to receive the first control signal; and
wherein the comparator circuit is adapted to generate, at the output, the data values of the data of the second data record such that they are inverted with respect to the data values of the data of the first data record or such that they match the data values of the data of the first data record in dependence on the state of the first control signal.

7. An integrated semiconductor memory, comprising:
a clock connection to apply a clock signal;
a memory cell array with memory cells to store data of a first data record that has a first or a second data value;
a data generator circuit with a first input connection to apply the data of the first data record, with a first output connection to output data of a second data record that has a first or a second data value, and with a second output connection to generate a first control signal with a first or a second state;
wherein the data generator circuit comprises an evaluation unit whose input is supplied with the first data record, the second data record and a second control signal with a first or a second state, the second control signal being delayed by one clock period of the clock signal with respect to the first control signal;
wherein the evaluation unit generates the first control signal with a state that depends on the data values of the data of the first and the second data record and a state of the second control signal; and
wherein the data generator circuit is adapted to generate the data values of the data of the second data record such that they are inverted with respect to the data values of the data of the first data record or such that they match the data values of the data of the first data record in dependence on the state of the second control signal.

8. The integrated semiconductor memory as claimed in claim 7,
wherein the data generator circuit has a second input connection to apply the second data record that is coupled to the first output connection of the data generator circuit to output the second data record; and
wherein the data generator circuit comprises a third input connection to apply the first control signal that is coupled to the second output connection of the data generator circuit to output the first control signal.

9. The integrated semiconductor memory as claimed in claim 8, comprising:
a first memory circuit to store the data of the second data record that is coupled to the second input connection of the data generator circuit; and
a second memory circuit to store the state of the first control signal that is coupled to the third input connection of the data generator circuit.

10. The integrated semiconductor memory as claimed in claim 9, wherein the evaluation unit comprises a comparator circuit to generate output signals, wherein an input of the comparator circuit is coupled to the first input connection of the data generator circuit and to the first memory circuit, said evaluation unit being supplied with the first data record from the first input connection of the data generator circuit and the second data record, which has been delayed by one clock period, from the first memory circuit.

11. The integrated semiconductor memory as claimed in claim 10,
wherein the evaluation unit comprises a decision circuit whose input is supplied with the output signals from the comparator circuit of the evaluation unit and the state of the second control signal; and
wherein the decision circuit is adapted to generate, at the output, the first control signal in dependence on the output signals of the comparator circuit and the state of the second control signal.

12. An integrated semiconductor memory, comprising:
a clock connection to apply a clock signal;
a memory cell array with memory cells to store data of a first data record which respectively have a first or a second data value;
a data generator circuit with a first input connection to apply the data of the first data record, with a first output connection to output data of a second data record that has a first or a second data value, and with a second output connection to generate a first control signal with a first or a second state;
wherein the data generator circuit comprises an evaluation unit whose input is supplied with the first data record, the second data record and a second control signal with a first or a second state, the second control signal being delayed by one clock period of the clock signal with respect to the first control signal;
wherein the evaluation unit generates the first control signal with a first state if at least half of the data of the first data record differs from the data values of the data of the second data record and the second control signal has a first state;
wherein the evaluation unit generates the first control signal with a second state if fewer than half of the data values of the data of the first data record differ from the data values of the data of the second data record;
wherein the data generator circuit is adapted to generate the data values of the data of the second data record such that they are inverted with respect to the data values of the data of the first data record if the first control signal has the first state; and
wherein the data generator circuit is adapted to generate the data values of the data of the second data record such that they match the data values of the data of the first data record if the first control signal has the second state.

13. The integrated semiconductor memory as claimed in claim 12,
wherein the data generator circuit comprises a second input connection to apply the second data record that is coupled to the first output connection of the data generator circuit to output the second data record; and
wherein the data generator circuit comprises a third input connection to apply the first control signal that is coupled to the second output connection of the data generator circuit to output the first control signal.

14. The integrated semiconductor memory as claimed in claim 13, comprising:

a first memory circuit to store the data of the second data record that is coupled to the second input connection of the data generator circuit; and a second memory circuit to store the state of the first control signal that is coupled to the third input connection of the data generator circuit.

15. The integrated semiconductor memory as claimed in claim 14, wherein the first memory circuit is adapted to generate, at the output, the data of the second data record such that they are delayed by one clock period of the clock signal with respect to the data of the second data record that have been supplied to its input and supplies them to the input of the evaluation circuit; and wherein the second memory circuit is adapted to generate, at the output, the state of the second control signal such that it is delayed by one clock period of the clock signal with respect to the state of the first control signal which has been supplied to its input and supplies the second control signal to the input of the evaluation circuit.

16. The integrated semiconductor memory as claimed in claim 15, wherein the first and second memory circuits each comprise a flip-flop circuit.

17. The integrated semiconductor memory as claimed in claim 15, wherein the evaluation unit comprises a comparator circuit to generate output signals, wherein an input of the comparator circuit is coupled to the first input connection of the data generator circuit and to the first memory circuit, said evaluation unit being supplied with the first data record from the first input connection of the data generator circuit and the second data record, which has been delayed by one clock period, from the first memory circuit; and wherein the comparator circuit of the evaluation unit is adapted to compare a respective data value of the data of the first data record with a respective data value of the data of the second data record and generates, at the output, a respective output signal with a first state if the respective data value of the data of the first data record matches the respective data value of the data of the second data record and generates, at the output, the respective output signal with a second state if the respective data value of the data of the first data record differs from the respective data value of the data of the second data record.

18. The integrated semiconductor memory as claimed in claim 17, wherein the comparator circuit of the evaluation unit comprises an XOR circuit.

19. The integrated semiconductor memory as claimed in claim 17, wherein the evaluation unit comprises a decision circuit whose input is supplied with the output signals from the comparator circuit of the evaluation unit and the state of the second control signal;

wherein the decision circuit is adapted to generate, at the output, the first control signal with the first state if at least half of the output signals from the comparator circuit have the first state and the second control signal has the first state; and wherein the decision circuit is adapted to generate, at the output, the first control signal with the second state if fewer than half of the output signals from the comparator circuit have the second state.

20. The integrated semiconductor memory as claimed in claim 19, wherein the data generator circuit comprises a comparator circuit whose input is connected to the first input connection of the data generator circuit to receive the data of the first data record and to the decision circuit to receive the first control signal;

wherein the comparator circuit is adapted to generate, at the output, the data values of the data of the second data record such that they are inverted with respect to the data values of the data of the first data record if the first control signal has the first state; and wherein the comparator circuit is adapted to generate, at the output, the data values of the data of the second data record such that they match the data values of the data of the first data record if the first control signal has the second state.

21. The integrated semiconductor memory as claimed in claim 20, wherein the comparator circuit of the data generator circuit comprises an XOR circuit.

22. The integrated semiconductor memory as claimed in claim 19, wherein the decision circuit comprises a first current generation unit and a second current generation unit;

wherein the output signals from the comparator circuit of the evaluation unit and the second control signal are supplied to the input of the first current generation unit;

wherein the output signals from the comparator circuit of the evaluation unit and the second control signal are each supplied in inverted form to the second current generation unit;

wherein the first current generation unit is adapted to generate, at the output, a first current whose level depends on the respective states of the output signals from the comparator circuit of the evaluation unit and on the state of the second control signal; and wherein the second current generation unit is adapted to generate, at the output, a second current whose level depends on the respective states of the inverted output signals from the comparator circuit of the evaluation unit and on the state of the inverted second control signal.

23. The integrated semiconductor memory as claimed in claim 22, wherein the decision circuit includes a comparator circuit to generate the first control signal and whose input is supplied with the first current and the second current; and wherein the comparator circuit of the decision circuit is adapted to compare a current intensity of the first current with a current intensity of the second current and generate the first control signal with the first or second state depending on the comparison.

24. The integrated semiconductor memory as claimed in claim 12, comprising:

at least one data connection to output data of a data record;

an output connection to output a control signal;

wherein the first output connection of the data generator circuit is coupled to the data connection of the integrated semiconductor memory; and wherein the second output connection of the data generator circuit is coupled to the output connection of the integrated semiconductor memory.

25. A method for operating an integrated semiconductor memory, the method comprising:

reading a first data record containing data from memory cells of a memory cell array for a first clock period of a clock signal;

reading a second data record containing data from a first memory circuit, the second data record having been stored in the first memory circuit one clock period before the first clock period;

generating a second control signal that depends on a state of a first control signal that was stored in the second memory circuit one clock period before the first clock period of the clock signal;

comparing data values of the data of the first data record with data values of the data of the second data record;

generating the first control signal with a first state if at least half of the data values of the data of the first data record differ from the data values of the data of the second data record and the second control signal has a first state;

generating the first control signal with a second state if fewer than half of the data values of the data of the first data record differ from the data values of the data of the second data record;

storing the first control signal in the second memory circuit;

generating the data values of the data of the second data record such that they are inverted with respect to the data values of the data of the first data record if the first control signal has the first state;

generating the data values of the data of the second data record such that they match the data values of the data of the first data record if the first control signal has the second state; and outputting the data values of the data of the second data record at least one data connection of the integrated semiconductor memory.

\* \* \* \* \*